United States Patent
Sherpa et al.

(10) Patent No.: US 10,937,662 B2
(45) Date of Patent: Mar. 2, 2021

(54) METHOD OF ISOTROPIC ETCHING OF SILICON OXIDE UTILIZING FLUOROCARBON CHEMISTRY

(71) Applicant: Tokyo Electron Limited, Tokyo (JP)

(72) Inventors: Sonam D. Sherpa, Albany, NY (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/406,644

(22) Filed: May 8, 2019

(65) Prior Publication Data
US 2020/0006081 A1   Jan. 2, 2020

Related U.S. Application Data

(60) Provisional application No. 62/691,856, filed on Jun. 29, 2018.

(51) Int. Cl.
*H01L 21/311* (2006.01)
*C09K 13/00* (2006.01)

(52) U.S. Cl.
CPC ........ *H01L 21/31116* (2013.01); *C09K 13/00* (2013.01)

(58) Field of Classification Search
CPC .......................... H01L 21/31116; C09K 13/00
See application file for complete search history.

(56) References Cited

U.S. PATENT DOCUMENTS

| | | | |
|---|---|---|---|
| 2008/0132074 A1 | 6/2008 | Kim | |
| 2009/0000640 A1* | 1/2009 | Aoki | H01L 21/02071 134/1.3 |
| 2011/0027999 A1* | 2/2011 | Sparks | C23F 4/00 438/712 |
| 2015/0228495 A1 | 8/2015 | Joubert et al. | |
| 2016/0211148 A1 | 7/2016 | Watanabe et al. | |
| 2019/0019685 A1* | 1/2019 | Tsuji | H01L 21/31144 |

FOREIGN PATENT DOCUMENTS

JP    2017208510 A    11/2017

OTHER PUBLICATIONS

International Search Report and Written Opinion for PCT/US2019/031313, Korean Intellectual Property Office, dated Aug. 20, 2019.
International Preliminary Report on Patentablity for PCT/US2019/031313 dated Jan. 7, 2021 (9 pages).

* cited by examiner

*Primary Examiner* — Roberts P Culbert
(74) *Attorney, Agent, or Firm* — Rothwell, Figg, Ernst & Manbeck, P.C.

(57) ABSTRACT

An isotropic plasma etch process for etching silicon oxide is provided. In an embodiment, a first step, a modification step, includes the use of a fluorocarbon based plasma. This modification step provides for the formation of an interface layer and the deposition of a fluorocarbon film on the surface of the silicon oxide. Then, a second step, a removal step includes the use of an oxygen (O2) based plasma. This removal step removes the fluorocarbon film and the interface layer. To promote isotropic etching, the plasma process is performed with little or no low frequency bias power applied to the system. Thus, ion attraction to the substrate is minimized by providing no low frequency power. Further, relatively high pressures are maintained so as to further promote isotropic behavior.

17 Claims, 8 Drawing Sheets

| Step | Time [s] | Pres [mT] | HF [W] | LF [W] | Vpp [V] | Temp [°C] | Center Gas [sccm] | | | Edge Gas [sccm] | | | Dvn. Proc. |
|---|---|---|---|---|---|---|---|---|---|---|---|---|---|
| | | | | | | | C4F6 | O2 | Ar | C4F6 | O2 | Ar | |
| FC Depo | 5 | *** | 1500 | 0 | - | 20 | - | - | 50 | 6 | - | 850 | 50 |
| O2 Flash | 60 | 100 | 2000 | 0 | - | 20 | - | 165 | - | - | 165 | - | |

FIG. 3

METHOD OF ISOTROPIC ETCHING OF SILICON OXIDE UTILIZING FLUOROCARBON CHEMISTRY

RELATED APPLICATIONS

This application claims priority to U.S. Provisional Patent Application No. 62/691,856, entitled, "Method of Isotropic Etching of Silicon Oxide Utilizing Fluorocarbon Chemistry," filed Jun. 29, 2018; the disclosure of which is expressly incorporated herein, in its entirety, by reference.

BACKGROUND

The present disclosure relates to the processing of substrates in plasma process equipment. In particular, it provides a method to control plasma etching of layers comprising oxides.

The use of plasma systems for the processing of substrates has long been known. For example, plasma processing of semiconductor wafers is well known. One well known use of plasma processing is for etching of substrates. Plasma etching is typically utilized to provide anisotropic etching of a substrate. When isotropic etching is required, chemical oxide removal (COR) is a common technique utilized. For example, for isotropic etching of silicon oxide, COR may commonly be utilized.

As geometries of substrate structures continue to shrink and the types of structures evolve, the use of COR techniques for isotropic etching has become less desirable. For example, the fabrication of nanosheet FETs raises new challenges for isotropic etching. It would be desirable to utilize a plasma process for isotropic etching.

One technique to improve plasma etching has been to utilize atomic layer etch (ALE) plasma processes. ALE processes are general known to involve processes which remove thin layers sequentially through one or more self-limiting reactions. Thus, ALE processes offer improved performance by decoupling the etch process into sequential steps of surface modification and removal of the modified surface, thereby allowing the segregation of the roles of radical flux and ion flux and energy. Such processes often include multiple cyclic series of layer modification and etch steps. The modification step may modify the exposed surfaces and the etch step may selectively remove the modified layer. Thus, a series of self-limiting reactions may occur. As used herein, an ALE process may also include quasi-ALE processes. In such processes, a series of modification and etch step cycles may still be used, however, the removal step may not be purely self-limiting as after removal of the modified layer, the etch substantially slows down, though it may not completely stop. In either case, the ALE based processes include a cyclic series of modification and etch steps.

One known ALE technique for etching silicon oxide includes the use of alternating a fluorocarbon film deposition step with an oxygen (O2) plasma step. For example, "Atomic Layer Etching of Silicon Oxide By Alternating an $O_2$ Plasma With Fluorocarbon Film Deposition," Tsutsumi, et al., J. Vac. Sci Technol. A 35(1) January/February 2017 discloses an ALE technique for etching silicon oxide. However, that technique is not suitable for isotropic etching of silicon oxide.

It would be desirable to provide an improved silicon oxide plasma etch process to provide isotropic etching.

SUMMARY

In one exemplary embodiment, described herein is an isotropic plasma etch process for etching silicon oxide. In one embodiment, an ALE process for etching silicon oxide is provided. However, it will be recognized that the concepts described herein may be applicable to the etching of other oxides, for example, metal oxides, germanium dioxide, silicon oxynitride, etc. In an embodiment, a first step (a modification step) includes the use of a fluorocarbon based plasma. In one embodiment, the first step includes the use of a Hexafluoro-1,3-butadiene (C4F6) based plasma. This modification step provides for the formation of an interface layer and the deposition of a fluorocarbon film on the surface of the silicon oxide. Then, a second step (a removal step) includes the use of an oxygen (O2) based plasma. This removal step removes the fluorocarbon film and the interface layer. To promote isotropic etching, the plasma process is performed with little or no low frequency bias power applied to the system. Thus, ion attraction to the substrate is minimized by providing no low frequency power. In this manner, ion bombardment based anisotropic mechanisms are minimized. Further, relatively high pressures are maintained so as to further promote isotropic behavior. The silicon oxide etch process utilizing C4F6 and O2 steps may be utilized in a wide range of substrate process steps. For example, the process may be utilized for, but is not limited to, isotropic etches utilized in oxide spacer etch steps, fin reveal steps, oxide mandrel pull steps, and oxide liner etch steps.

In one embodiment, a method for etching a substrate is provided. The method may comprise providing a first layer comprising silicon oxide. The method may further comprise exposing the first layer to a first plasma comprising a fluorocarbon based plasma to modify at least a surface of the first layer to form a modified surface layer, the modified surface layer comprising at least a fluorocarbon layer. The method may also comprise exposing the modified surface layer to a second plasma comprising oxygen (O2), the second plasma removing at least a portion of the modified surface layer wherein least the second plasma is formed with only a high frequency power source without use of another power source for attracting ions to the substrate. The combination of use of the first plasma and the second plasma provides an isotropic process for removing at least some of the silicon oxide.

In another embodiment, a method for etching a substrate is provided. The method comprises providing a first layer comprising silicon oxide. The method also comprises performing an isotropic etch process to etch the first layer, the isotropic etch process comprising, multiple cycles of (1) a surface modification step comprising a first plasma, the first plasma comprising a fluorocarbon based plasma and (2) a removal step following the surface modification step, the removal step comprising a second plasma, the second plasma comprising O2. At least the second plasma is formed with only a high frequency power source.

In another embodiment, a method for etching a substrate is provided. The method may comprise providing a first layer comprising silicon oxide and exposing the first layer to a first plasma comprising C4F6 to modify at least a surface of the first layer to form a modified surface layer, the modified surface layer comprising at least a fluorocarbon layer. The method may further comprise exposing the modified surface layer to a second plasma comprising oxygen (O2), the second plasma removing at least a portion of the modified surface layer. According to the method, at least the second plasma is formed with only a high frequency power source without use of another power source for attracting ions to the substrate, multiple cycles of the exposing the first layer to a first plasma comprising the fluorocarbon and exposing the modified surface layer to a second plasma comprising O2 are performed, and a combination of use of the first plasma and the second plasma provides an isotropic process for removing at least some of the silicon oxide.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 3 illustrates one exemplary set of process conditions for performing the two step isotropic etch process described herein.

DETAILED DESCRIPTION

In one exemplary embodiment, described herein is an isotropic plasma etch process for etching silicon oxide. In one embodiment, an ALE process for etching silicon oxide is provided. However, it will be recognized that the concepts described herein may be applicable to the etching of other oxides, for example, metal oxides, germanium dioxide, silicon oxynitride, etc. In an embodiment, a first step (a modification step) includes the use of a fluorocarbon based plasma. In one embodiment, the first step includes the use of a Hexafluoro-1,3-butadiene (C4F6) based plasma. This modification step provides for the formation of an interface layer and the deposition of a fluorocarbon film on the surface of the silicon oxide. Then, a second step (a removal step) includes the use of an oxygen (O2) based plasma. This removal step removes the fluorocarbon film and the interface layer. To promote isotropic etching, the plasma process is performed with little or no low frequency bias power applied to the system. Thus, ion attraction to the substrate is minimized by providing no low frequency power. In this manner, ion bombardment based anisotropic mechanisms are minimized. Further, relatively high pressures are maintained so as to further promote isotropic behavior. The silicon oxide etch process utilizing C4F6 and O2 steps may be utilized in a wide range of substrate process steps. For example, the process may be utilized for, but is not limited to, isotropic etches utilized in oxide spacer etch steps, fin reveal steps, oxide mandrel pull steps, and oxide liner etch steps.

Figure 1:
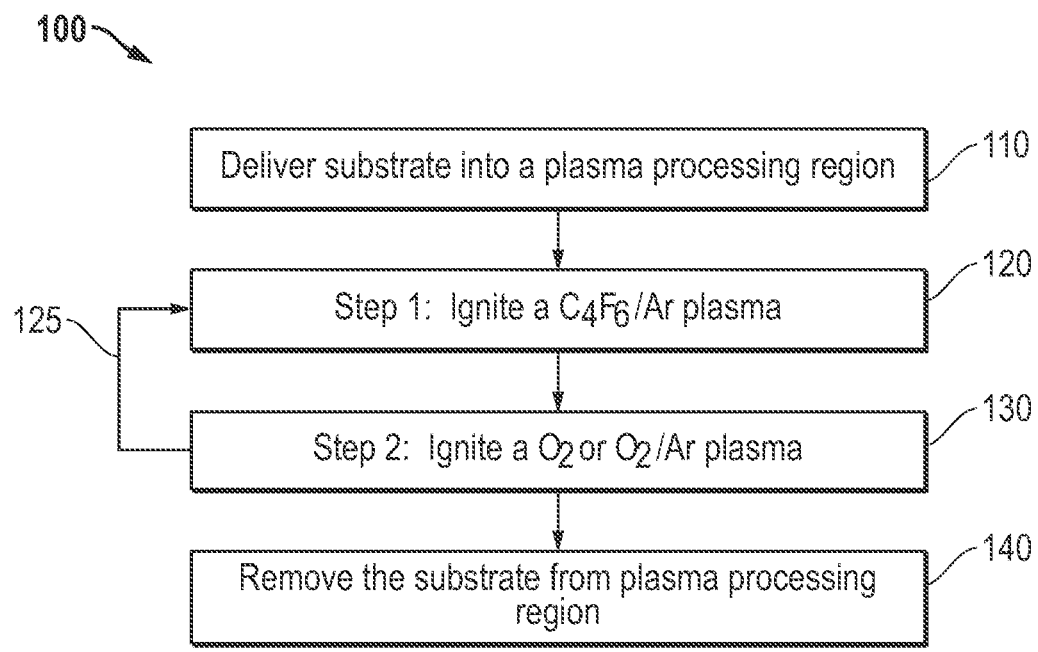
FIG. 1 illustrates one exemplary process flow utilizing the etch methods described herein.

More specifically, FIG. 1 illustrates an exemplary isotropic etch process for etching oxide according to the techniques disclosed herein. In FIG. 1, the process 100 is illustrated by the initial delivery 110 of a substrate into a plasma processing region. Next, a fluorocarbon based plasma is ignited in step 1, block 120. In one embodiment, the fluorocarbon based plasma is a C4F6 plasma. The substrate is then subjected to step 2, block 130 where an oxygen plasma is ignited and the substrate exposed to the oxygen plasma. It should be noted that argon or other inert gas can be used as a co-feed with the C4F6 and oxygen. If additional etching is desired, the substrate is returned to step 1 block 120 as indicated by line 125 for an additional cycle of steps 1 and 2. If etching is complete, the substrate is removed from the plasma processing region as shown in removal block 140.

As shown in FIG. 1, the isotropic process starts with a fluorocarbon based plasma step that operates as a layer modification step. In one embodiment, the first step is a C4F6/Argon plasma step that operates as a layer modification step. Then, an O2 or O2/Argon plasma step is performed to remove the modified layer generated in the layer modification step. The modification and removal steps may then be repeated a sufficient number of cycles so as to complete the removal of the desired amount of oxide. In one embodiment, the oxide is silicon oxide.

Figure 2A:
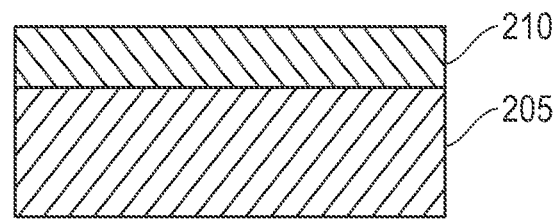
FIGS. 2A-2C illustrate the surface mechanisms which may occur in the steps of the methods of one embodiment described herein.
Figure 2B:
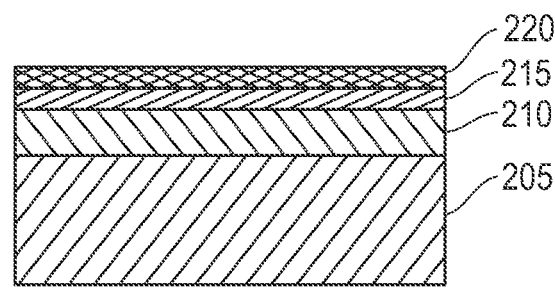
Figure 2C:
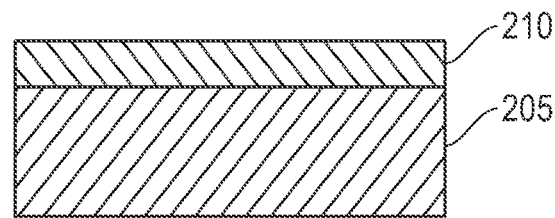

FIGS. 2A-2C illustrate mechanisms that may occur in each step of the isotropic etch process of FIG. 1. It will be recognized that the mechanisms disclosed are merely exemplary, and other mechanisms may occur. FIGS. 2A-2C are illustrative and not intended to show precise substrate modifications. As shown in FIG. 2A, an oxide (for example silicon oxide) 210 is provided. The oxide 210 may be provided upon another layer 205 (for example a silicon layer or any number of layers that may be formed as part of a substrate which is being processed). As shown in FIG. 2B, in the modification step, regions at the surface of the oxide 210 form an interface layer 215 (for example silicon, oxygen, fluorine and carbon species) and also a fluorocarbon film 220 is deposited on the surface. Then, in the removal step (step 2), as shown in FIG. 2C, the fluorocarbon film 220 and interface layer 215 are removed due to the etching action of the O2/Argon plasma. Thus, the oxide 210 that remains may be thinner than the oxide 210 at the start of the process. This process may be repeated in multiple cycles to incrementally remove the oxide 210 until the preferred amount of oxide removal is achieved.

The isotropic nature of the process of FIG. 1 is achieved by performing the steps at pressures and powers that minimize ion bombardment of the oxide surface. As is known in the art, plasma etching may commonly utilize two oscillating frequency power sources, one high frequency power source utilized to generate the plasma and a second power source that is a lower frequency (relative to the high frequency) power source that may be utilized to draw or attract ions to the substrate, such as for example in plasmas created in capacitively coupled plasma (CCP) systems or plasmas created in inductively coupled plasma (ICP) systems. For example, in capacitively coupled plasma systems, the high frequency power may often be coupled to an upper electrode of a plasma process chamber and provide frequencies in the range of 30-300 MHz. In CCP systems, the low frequency power source may often be coupled to a lower electrode of a plasma process chamber and provide lower frequencies in the range of 2-20 MHz. In an ICP system, the high frequency power source may be again coupled to an upper electrode and in this case have a frequency of typically 13.56 MHz and the low frequency power source may be coupled to a lower electrode and have a frequency of less than 10 MHz and more typically around 3.2 MHz. Thus, though the frequencies may vary, the low frequency power sources can be characterized as the power source that is utilized to attract ions to the substrate.

To promote isotropic behavior, in one embodiment, the techniques described herein minimize the use of a low frequency power source (for example, no oscillating frequency power sources of less than 20 MHz in CCP systems and no oscillating frequency power sources of less than 10 MHz in ICP systems). Thus, in one embodiment, etching is performed using an isotropic process only utilizing oscillating power frequencies of greater than 20 MHz. In another embodiment, etching is performed using an isotropic process only utilizing oscillating power frequencies of greater than 10 MHz. Further, relatively high pressures are maintained in the system to further promote isotropic behavior, for example greater than 50 mTorr and more preferably at 100 mTorr or higher. In one embodiment, no low frequency power is utilized in the removal step. In one embodiment, the pressure of the removal step is greater than 50 mTorr. In another embodiment no low frequency power is utilized in both the modification step and the removal step.

An exemplary process for performing the two step isotropic plasma silicon oxide removal process is shown in Table 300 of FIG. 3. As shown in FIG. 3, the first step (modification and deposition) is labeled FC Depo and the second step (removal) is labeled O2 Flash.

Thus, a plasma isotropic process is provided in which lateral etching and horizontal etching occurs. As described herein, isotropic etching provides equal lateral and horizontal etching ±15%.

The two-step isotropic process described herein may be utilized in a wide variety of applications at various points of differing substrate process flows. For example, the isotropic process may be used at silicon fin reveal steps, oxide mandrel pull steps, oxide spacer etch steps, and oxide liner etch steps. FIGS. 4A-7B provide exemplary uses of the isotropic process described herein in a variety of substrate process flows. It will be recognized that the isotropic process described herein may be utilized in many other substrate processing applications. In one embodiment, the substrate may be any substrate for which the use of patterned features is desirable. For example, in one embodiment, the substrate may be a semiconductor substrate having one or more semiconductor processing layers formed thereon. In one embodiment, the substrate may be a substrate that has been subject to multiple semiconductor processing steps which yield a wide variety of structures and layers, all of which are known in the substrate processing art.

In one embodiment, process steps in which isotropic removal of silicon oxide may be desired may suitably utilize the techniques disclosed herein. In one embodiment, the techniques may be utilized for removal of silicon oxide during a semiconductor substrate processing flow, and more particular, semiconductor wafer processing flow.

Figure 4A:
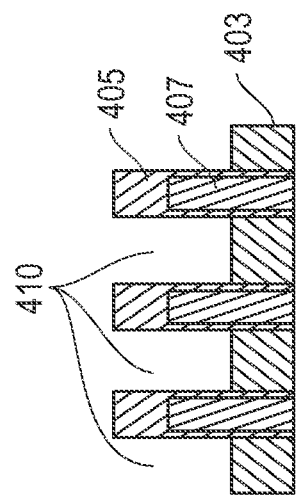
FIGS. 4A-4B illustrate a representative application of the method herein in a fin reveal application.
Figure 4B:
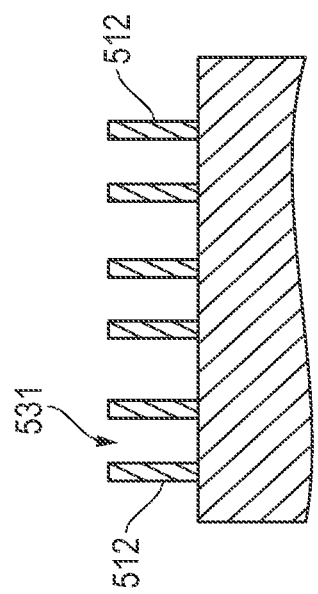

FIGS. 4A-4B illustrate an application of the isotropic plasma process techniques disclosed herein in a fin reveal application. As shown in FIG. 4A, a fin 407 is protected by a silicon nitride layer 405. Silicon oxide 403 is provided around the fin 407 regions as shown in FIG. 4A. The silicon oxide 403 may be removed (in this example partially removed) via use of the isotropic plasma silicon oxide etch process disclosed herein. In this manner, the silicon oxide 403 may be removed isotropically in regions 410 but still selectively to the silicon nitride layer 405 to achieve a structure such as shown in FIG. 4B.

Figure 5A:
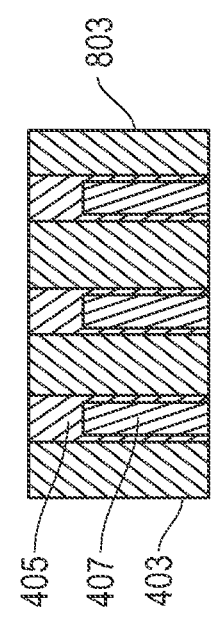
FIGS. 5A-5B illustrate a representative application of the method described herein in an oxide mandrel pull application.
Figure 5B:
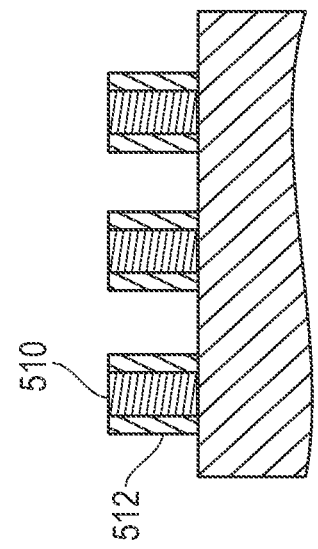

FIGS. 5A-5B illustrate an application of the isotropic process techniques disclosed herein in a mandrel pull application, in this case a silicon oxide mandrel pull application. As shown in the figures, a silicon oxide mandrel 510 may be surrounded by silicon or silicon nitride 512, such as for example, spacers formed on the sides of the silicon oxide mandrel 510. The isotropic silicon oxide plasma process described herein may be utilized to remove (pull) the silicon oxide mandrel 510, leaving the spaces 531 remaining post-etch as shown in FIG. 5B.

Figure 6A:
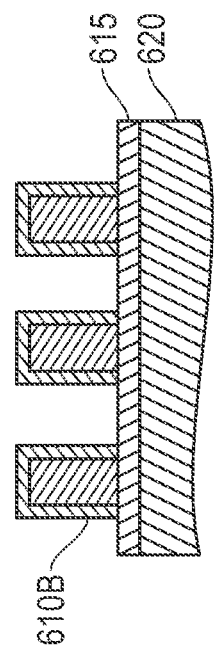
FIGS. 6A-6B illustrate a representative application of the method described herein in a silicon oxide spacer trim application.
Figure 6B:
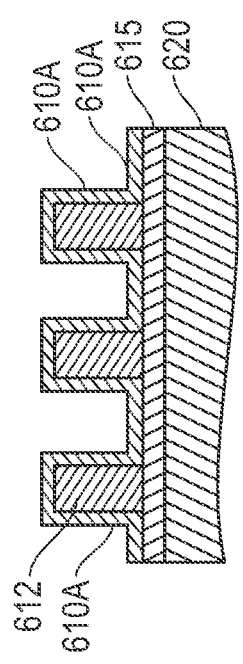

FIGS. 6A-6B illustrate an application of the process techniques disclosed herein in a silicon oxide trim application, more specifically a silicon oxide spacer trim application. As shown in the FIG. 10A, a silicon oxide spacer 610A may be formed around a structure 612 (for example a silicon or silicon nitride structure). The silicon oxide spacer 610A may be formed over an etch stop layer 615 and substrate 620. The isotropic process described herein may be utilized to trim a portion of the silicon oxide spacer 610A width in a controlled manner so as to narrow the silicon oxide spacer 610A to produce a narrower silicon oxide spacer 610B as shown in the FIG. 6B.

Figure 7A:
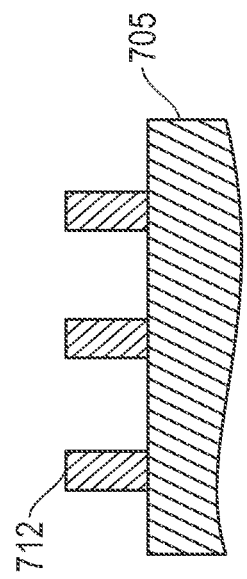
FIGS. 7A-7B illustrates a representative application of the method described herein in a silicon oxide liner etch application.
Figure 7B:
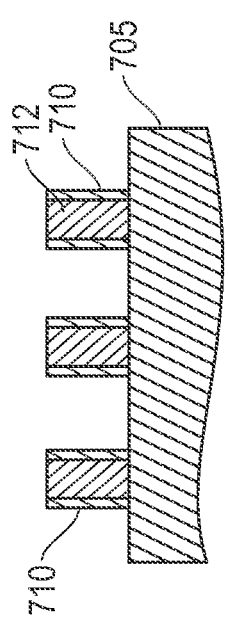

FIGS. 7A-7B illustrate an application of the isotropic process techniques disclosed herein in a silicon oxide liner etch application. As shown in the figures, a silicon oxide liner 710 may line the sides of a structure 712 (for example a silicon or silicon nitride structure) that is formed on a substrate 705. The silicon oxide liner 710 may then be removed in an isotropic manner selective to the structure 712 to produce the structure as shown in the FIG. 7B by utilizing the isotropic plasma silicon oxide etch process disclosed herein as an oxide liner etch.

Figure 8:
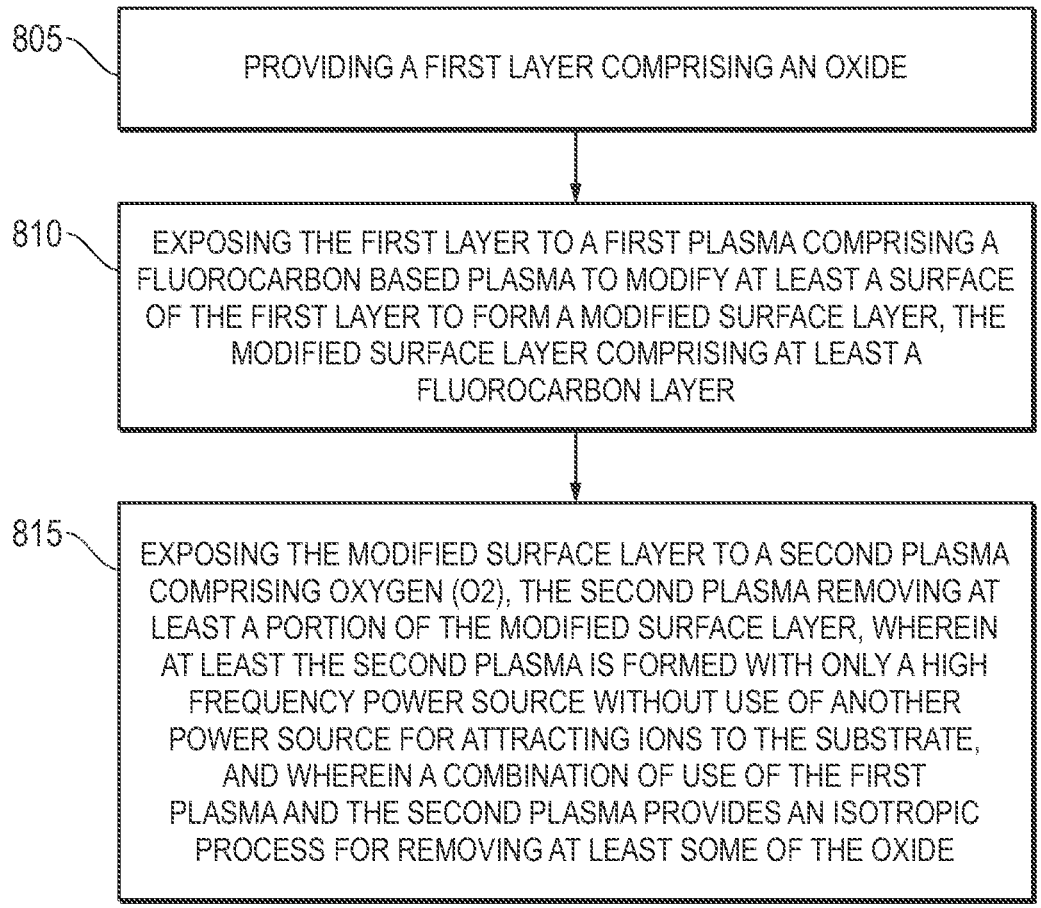
FIGS. 8-10 illustrate a representative flow diagrams of the methods disclosed herein.
Figure 9:
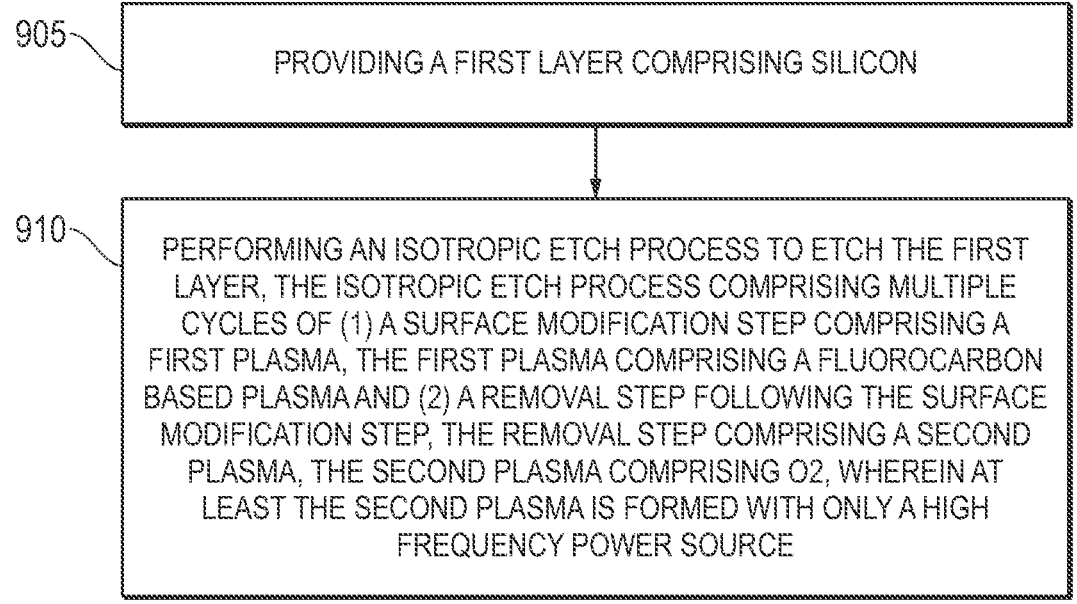
Figure 10:
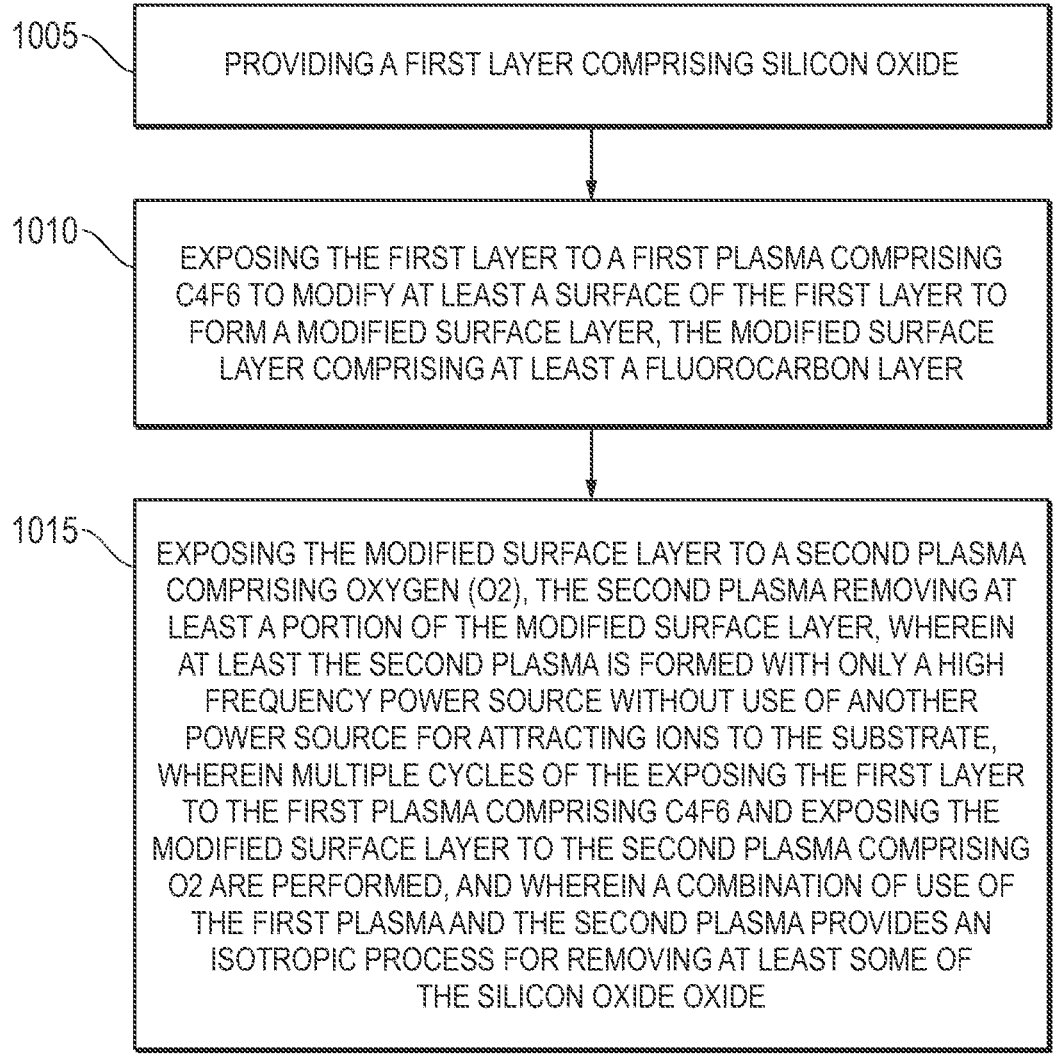

It will be recognized that the process flows described above are merely exemplary, and many other processes and applications may advantageously utilize the techniques disclosed herein. FIGS. 8-10 illustrate exemplary methods for use of the processing techniques described herein. It will be recognized that the embodiments of FIGS. 8-10 are merely exemplary and additional methods may utilize the techniques described herein. Further, additional processing steps may be added to the methods shown in the FIGS. 8-10 as the steps described are not intended to be exclusive. Moreover, the order of the steps is not limited to the order shown in the figures as different orders may occur and/or various steps may be performed in combination or at the same time.

In FIG. 8, a method for etching a substrate is shown. The method may include step 805 of providing a first layer comprising an oxide. The method further includes step 810 of exposing the first layer to a first plasma comprising a fluorocarbon based plasma to modify at least a surface of the first layer to form a modified surface layer, the modified surface layer comprising at least a fluorocarbon layer. The method also includes step 815 of exposing the modified surface layer to a second plasma comprising oxygen (O2), the second plasma removing at least a portion of the modified surface layer, wherein at least the second plasma is formed with only a high frequency power source without use of another power source for attracting ions to the substrate, and wherein a combination of use of the first plasma and the second plasma provides an isotropic process for removing at least some of the oxide.

In FIG. 9, a method of for etching a substrate is shown. The method may include step 905 of providing a first layer comprising silicon oxide. The method further includes step 910 of performing an isotropic etch process to etch the first layer, the isotropic etch process comprising, multiple cycles of (1) a surface modification step comprising a first plasma, the first plasma comprising a fluorocarbon based plasma and (2) a removal step following the surface modification step, the removal step comprising a second plasma, the second plasma comprising O2, wherein at least the second plasma is formed with only a high frequency power source.

In FIG. 10, a method for etching a substrate is shown. The method may include step 1005 of providing a first layer comprising silicon oxide. The method further comprises step 1010 of exposing the first layer to a first plasma comprising C4F6 to modify at least a surface of the first layer to form a modified surface layer, the modified surface layer comprising at least a fluorocarbon layer. The method also comprises step 1015 of exposing the modified surface layer to a second plasma comprising oxygen (O2), the second plasma removing at least a portion of the modified surface layer, wherein at least the second plasma is formed with only a high frequency power source without use of another power source for attracting ions to the substrate, wherein multiple cycles of the exposing the first layer to the first plasma comprising C4F6 and exposing the modified surface layer to the second plasma comprising O2 are performed, and wherein a combination of use of the first plasma and the second plasma provides an isotropic process for removing at least some of the silicon oxide.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method for etching a substrate, comprising:
   providing a substrate comprising an underlying layer and at least a first layer comprising an oxide above the underlying layer, the first layer having at least one surface;
   performing a two-step process at least once, the two-step process comprising:
   a first process step of exposing at least one surface of the first layer to a first plasma comprising a fluorocarbon based plasma, wherein the first plasma forms a modified surface layer on the at least one surface of the first layer, the modified surface layer comprising at least an interface layer and a fluorocarbon layer on at least a portion of the interface layer; and
   after the first process step, a second process step of exposing the modified surface layer to a second plasma at a pressure greater than 100 mTorr, the second plasma comprising oxygen (O2), wherein the second plasma etch removes at least a portion of the modified surface layer,
   wherein at least the second plasma is formed with only a high frequency power source without use of another power source for attracting ions to the substrate, and
   wherein a combination of use of the first plasma and the second plasma provides an isotropic process for removing at least some of the oxide.

2. The method of claim 1, wherein the first plasma and the second plasma are created with a capacitively coupled plasma system, the isotropic process only utilizing oscillating power frequencies of greater than 20 MHz.

3. The method of claim 1, wherein no power sources less than 10 MHz are utilized to create the first plasma and the second plasma.

4. The method of claim 1, wherein C4F6 is used in the first plasma.

5. The method of claim 1, wherein the underlying layer comprises at least one fin that protrudes from the substrate, wherein the at least one fin is surrounded by a silicon nitride layer, and wherein the first layer is deposited on the silicon nitride layer and the underlying layer.

6. The method of claim 1, wherein the substrate further comprises at least one protrusion,
   wherein there is a space gap surrounding the at least one protrusion,
   wherein the underlying layer is deposited on the at least one protrusion such that the space gap around the at least one protrusion is smaller than before the underlying layer is deposited,
   wherein the first layer is deposited on the underlying layer, such that the space gap around the at least one protrusion is smaller than before the first layer is deposited.

7. A method for etching a substrate, comprising:
   providing a substrate having an underlying layer, an etch stop layer covering at least a portion of the underlying layer, and a first layer covering at least a portion of the etch stop layer, the first layer having at least one surface;
   performing at least one cycle of an isotropic etch process to etch at least one surface of the first layer, the at least one cycle of the isotropic etch process comprising:
   utilizing a first plasma formed with a single high frequency power source at a pressure greater than 100 mTorr and comprising C4F6 to form a modified surface layer on the at least one surface of the first layer; and
   a after the surface modification step, utilizing a second plasma formed with a single high frequency power source and comprising O2 to remove at least a portion of the modified surface layer.

8. The method of claim 7, wherein the first plasma and the second plasma are created with a capacitively coupled plasma system, the isotropic process only utilizing oscillating power frequencies of greater than 20 MHz.

9. The method of claim 7, wherein the first plasma and the second plasma are created with an inductively coupled plasma system, the isotropic process only utilizing oscillating power frequencies of greater than 10 MHz.

10. A method for etching a substrate, comprising:
    providing a first layer comprising silicon oxide, wherein the first layer comprises a plurality of surfaces;
    exposing the first layer to a first plasma comprising C4F6 to form a modified surface layer on at least one surface of the first layer, the modified surface layer comprising at least a fluorocarbon layer and an interface layer under the fluorocarbon layer; and
    exposing the modified surface layer to a second plasma comprising oxygen (O2), the second plasma removing the fluorocarbon layer and at least a portion of the interface layer,
    wherein the first and the second plasma are formed with only a high frequency power source without use of another power source for attracting ions to the substrate, wherein multiple cycles of the exposing the first layer to the first plasma comprising C4F6 and exposing the modified surface layer to the second plasma comprising O2 are performed, and wherein a combination of use of the first plasma and the second plasma provides an isotropic process for removing at least some of the silicon oxide.

11. The method of claim 10, wherein the first plasma and the second plasma are created with a capacitively coupled plasma system, the isotropic process only utilizing oscillating power frequencies between 20 MHz and 40 MHz.

12. The method of claim 1, wherein the first plasma and the second plasma are created with an inductively coupled plasma system, the isotropic process only utilizing oscillating power frequencies between 3.2 MHz and 13.56 MHz.

13. The method of claim 1, wherein the first plasma and the second plasma are created with a capacitively coupled plasma system, the isotropic process only utilizing oscillating power frequencies between 2 MHz and 300 MHz.

14. The method of claim 1, wherein the underlying layer comprises an etch stop layer.

15. The method of claim 7, wherein at least one structure is deposited on the etch stop layer and the first layer is comprised of silicon oxide, and the first layer is further provided on the at least one structure.

16. The method of claim 7, further including forming the first plasma and the second plasma with an inductively coupled plasma system, the isotropic process only utilizing oscillating power frequencies of between 10 MHz and 30 MHz.

17. The method of claim 7, wherein the second plasma further comprises Argon.

* * * * *